(12) United States Patent
Zampardi et al.

(10) Patent No.: US 9,673,271 B2
(45) Date of Patent: Jun. 6, 2017

(54) ADAPTIVE CAPACITORS WITH REDUCED VARIATION IN VALUE AND IN-LINE METHODS FOR MAKING SAME

(71) Applicant: RF Micro Devices, Inc., Greensboro, NC (US)

(72) Inventors: Peter J. Zampardi, Newbury Park, CA (US); Brian Moser, Jamestown, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/880,759

(22) Filed: Oct. 12, 2015

(65) Prior Publication Data

US 2017/0104055 A1    Apr. 13, 2017

(51) Int. Cl.
| | |
|---|---|
| H01L 21/66 | (2006.01) |
| H01L 49/02 | (2006.01) |
| H01L 23/528 | (2006.01) |
| H01L 23/522 | (2006.01) |
| H01G 4/30 | (2006.01) |

(52) U.S. Cl.
CPC ............ *H01L 28/60* (2013.01); *H01G 4/306* (2013.01); *H01L 22/20* (2013.01); *H01L 22/22* (2013.01); *H01L 23/528* (2013.01); *H01L 23/5226* (2013.01); *H01L 28/87* (2013.01)

(58) Field of Classification Search
CPC ......... H01L 22/14; H01L 22/20; H01L 22/22; H01L 28/60; H01L 28/86; H01L 28/87; H01L 28/88; H01G 4/306; H01G 4/33; H01G 5/019
See application file for complete search history.

(56) References Cited

U.S. PATENT DOCUMENTS

| | | | | |
|---|---|---|---|---|
| 5,745,335 A | * | 4/1998 | Watt ................. | H01G 4/232 257/E21.011 |
| 8,363,380 B2 | * | 1/2013 | Lan .................. | H01P 1/127 361/281 |

(Continued)

OTHER PUBLICATIONS

Brady, Ronan et al., "A Cost Effective Approach for the Development of a Laminate VCO Platform in both GaAs and SiGe Process Technologies," M/A-COM Technology Solutions, 4 Eastgate Road, Little Island Cork, Ireland, Date Unknown, 5 pages.

(Continued)

*Primary Examiner* — Stephen W Smoot
(74) *Attorney, Agent, or Firm* — Withrow & Terranova, P.L.L.C.

(57) ABSTRACT

A method of making a capacitor with reduced variance comprises providing a bottom plate in a first metal layer, a first dielectric material over the bottom plate, and a middle plate in a second metal layer to form a first capacitor. The method also comprises measuring the capacitance of the first capacitor, and determining whether to couple none, one, or both of a second capacitor and a third capacitor in parallel with the first capacitor. The method may further comprise the steps of providing a second dielectric material over the middle plate, and providing a first top plate and a second top plate in a third metal layer to form the second capacitor, and a third capacitor. Electrical connections may be formed to couple one or both of the second capacitor and the third capacitor in parallel with the first capacitor based on the measured value of the first capacitor.

18 Claims, 6 Drawing Sheets

(56) References Cited

U.S. PATENT DOCUMENTS

| | | | | |
|---|---|---|---|---|
| 2010/0125989 | A1* | 5/2010 | Huang | H01G 4/33 29/25.42 |
| 2010/0296225 | A1* | 11/2010 | Smith | G08B 13/2437 361/311 |
| 2012/0326176 | A1* | 12/2012 | Shirouzu | H01L 27/3265 257/88 |
| 2013/0316646 | A1* | 11/2013 | Steeneken | H01L 28/60 455/41.1 |

OTHER PUBLICATIONS

Jayakumar, Nikhil et al., "Metal and VIA Maskset Programmable VLSI Design Methodology using PLAs," IEEE/ACM International Conference on Computer Aided Design 2004 (ICCAD-2004), Nov. 7-11, 2004, IEEE, pp. 590-594.

* cited by examiner

ADAPTIVE CAPACITORS WITH REDUCED VARIATION IN VALUE AND IN-LINE METHODS FOR MAKING SAME

FIELD OF THE DISCLOSURE

The present disclosure relates to adaptive capacitors having reduced variation in value and in-line methods for making such adaptive capacitors.

BACKGROUND

For yield and performance repeatability the control of capacitor values is critical. It is desirable to have on-wafer capacitors have a capacitance value within a three percent (3%) tolerance. Too much variation in the capacitor values impacts the yield of any circuits, such as power amplifier circuits, or integrated passive networks, in which the capacitors are used. Two common places uses for precision capacitors are inter-stage matching and output matching. In particular, harmonic traps are becoming popular and require a greater degree of control for the capacitor value because it interacts with bond wire inductance.

What has been previously proposed to control the value of the capacitors is to wire in capacitors of the same type (just connecting capacitors made from the same dielectric at the same time) but this approach requires extra layout area. In addition, for "stacked" capacitors, this method cannot be employed because the capacitor cannot be measured before the process wiring is completed, and it would require an additional metal layer, thereby increasing cost.

Figure 1A:
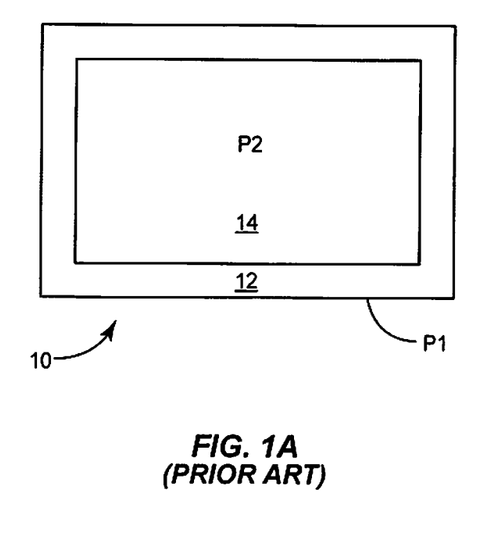
FIGS. 1A and 1B illustrate one prior art method where a capacitor value is changed by modifying the size of the top plate of the capacitor.
Figure 1B:
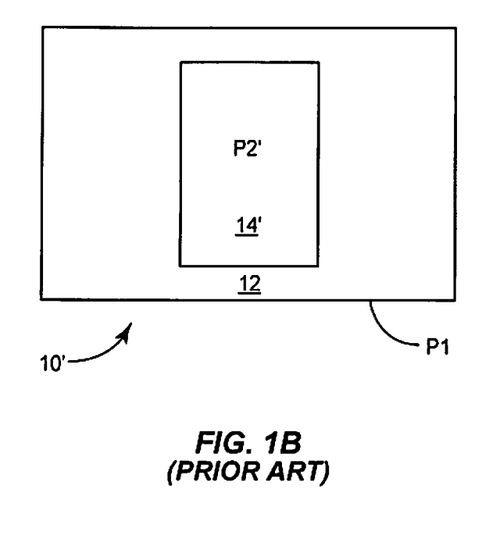

For example, referring to FIGS. 1A and 1B, one prior art method is shown where the capacitor value is changed by modifying the size of the top plate of the capacitor. Referring to FIG. 1A, capacitor 10 having a capacitor value is formed by a bottom plate P1 12 and a top plate P2 14. The capacitor value can be changed by modifying the top plate size, as shown in FIG. 1B. The capacitor 10' having a different capacitor value than capacitor 10 is formed by a bottom plate P1 12 and modified top plate P2' 14', where the modified top plate P2' 14' is of a different size than top plate P2 14 in FIG. 1A. However, this type of change is done as a mask revision, and is not done in response to measuring the capacitor value of a specific wafer, and thus only retargets the "nominal" capacitor. This change cannot be "adapted" because it is not possible to measure the value of the capacitor, and then correct the value of the capacitor, using this configuration.

Figure 2:
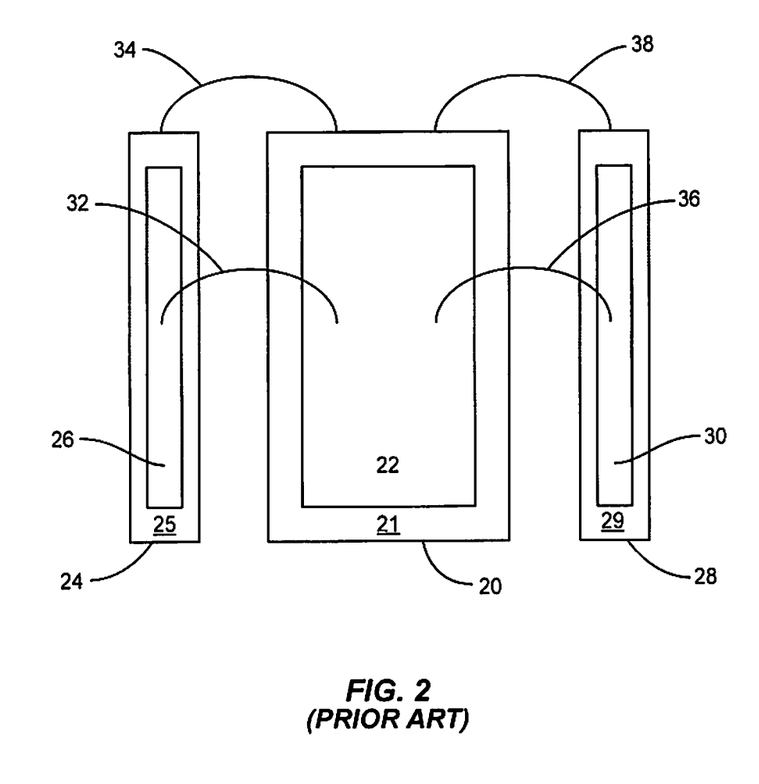
FIG. 2 shows another prior art approach, where three side by side capacitors are shown, with the value of the capacitor being changed by wiring a center capacitor to a left and a right capacitor.

FIG. 2 shows another prior art approach, where three side by side capacitors are shown, with a center capacitor formed by a bottom plate 21 and a top plate 22, and two adjacent capacitors—a left capacitor 24, which is formed by bottom plate 25 and top plate 26, and a right capacitor 28, which is formed by a bottom plate 29 and a top plate 30. In order to add to the capacitor value, the center capacitor 20 can then be wired to the left capacitor 24 by means of a wire 32 between top plate 26 of left capacitor 24 and the top plate 22 of center capacitor 20 and a wire 34 between bottom plate 25 of the left capacitor 24 and the bottom plate 21 of the center capacitor 20. In order to further add to the capacitor value, the center capacitor 20 can then be wired to the right capacitor 28 by means of a wire 36 between top plate 30 of right capacitor 28 and the top plate 22 of center capacitor 20 and a wire 38 between bottom plate 29 of the right capacitor 28 and the bottom plate 21 of the center capacitor 20.

This method requires an additional wiring layer be available above the level of the capacitor. This method would require a large amount of space (capacitors are side-by-side and design rules will make them some distance apart—bottom plates would also need to be connected separately). In a silicon process, this method would be implemented using a combination of vias and wiring.

The present disclosure describes in-line methods for making adaptive capacitors resulting in an on-wafer capacitor that can be corrected—in the wafer process. In addition, the proposed solution minimizes the layout area required for adaptation.

SUMMARY

A method of making a capacitor with reduced variance in value is disclosed. The method comprises providing a bottom plate in a first metal layer, providing a first dielectric material over the bottom plate, and providing a middle plate in a second metal layer such that the middle plate resides over the bottom plate to form a first capacitor with a first capacitance. The method also comprises measuring the capacitance of the first capacitor, and determining whether to couple none, one, or both of a second capacitor and a third capacitor in parallel with the first capacitor. The method may further comprise the steps of providing a second dielectric material over the middle plate, and providing a first top plate and a second top plate in a third metal layer such that the first top plate and the second top plate reside over the middle plate, wherein the first top plate and the middle plate form the second capacitor with a second capacitance, and the second top plate and the middle plate form the third capacitor with a third capacitance. Electrical connections may be formed to couple one or both of the second capacitor and the third capacitor in parallel with the first capacitor if the determining whether to couple none, one, or both of a second capacitor and a third capacitor in parallel with the first capacitor results in a determination to couple one or both of the second capacitor and the third capacitor in parallel with the first capacitor.

In this manner, by measuring the capacitance of the first, bottom capacitor prior to the deposition of the second and/or third capacitor, different or corrected capacitors can be formed when the top plate(s) of the capacitor is placed, thereby improving the tolerance of the capacitance of the capacitor by correcting for values measured in the first, bottom capacitor.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

A method of making a capacitor with reduced variance in value is disclosed. The method comprises providing a bottom plate in a first metal layer, providing a first dielectric material over the bottom plate, and providing a middle plate in a second metal layer such that the middle plate resides over the bottom plate to form a first capacitor with a first capacitance. The method also comprises measuring the capacitance of the first capacitor, and determining whether to couple none, one, or both of a second capacitor and a third capacitor in parallel with the first capacitor. The method may further comprise the steps of providing a second dielectric material over the middle plate, and providing a first top plate and a second top plate in a third metal layer such that the first top plate and the second top plate reside over the middle plate, wherein the first top plate and the middle plate form the second capacitor with a second capacitance, and the second top plate and the middle plate form the third capacitor with a third capacitance. Electrical connections may be formed to couple one or both of the second capacitor and the third capacitor in parallel with the first capacitor if the determining whether to couple none, one, or both of a second capacitor and a third capacitor in parallel with the first capacitor results in a determination to couple one or both of the second capacitor and the third capacitor in parallel with the first capacitor.

The first, or bottom, capacitor is part of the "nominal" capacitor, i.e., the one that is being formed to have a desired capacitance value. In one embodiment, the first capacitor will be formed to have a capacitance value of slightly less than the desired capacitance value (approximately 97% in one embodiment). A pair of top capacitors with small capacitances relative to the first capacitor may be formed, where the capacitance value of one of the top capacitors may be approximately three percent (3%) of the desired capacitance value. In this way, the first, bottom capacitor plus one of the top capacitors target the nominal desired value. The capacitance of the first, bottom capacitance is measured. If the measured value of the first, bottom capacitor is too high (above than the desired value), then no top capacitors are coupled to the first, bottom capacitor. If the measured value of the first, bottom capacitor is too low (outside of a certain tolerance from the desired value), then both of the two top capacitors are coupled to the first, bottom capacitor. If the measured value of the first, bottom capacitor is close to the desired value (less than the desired value, but within the tolerance), then one of the top capacitors is coupled to the first, bottom capacitor. In this manner, by selectively adding additional capacitors to the first, bottom capacitor if needed based on the measured capacitance value of the first, bottom capacitor, the desired value of the nominal capacitor is better controlled. Having adaptive capacitors of this type results in better yield and tolerance without having to improve process control, which can be expensive and may offer diminishing returns.

Figure 3:
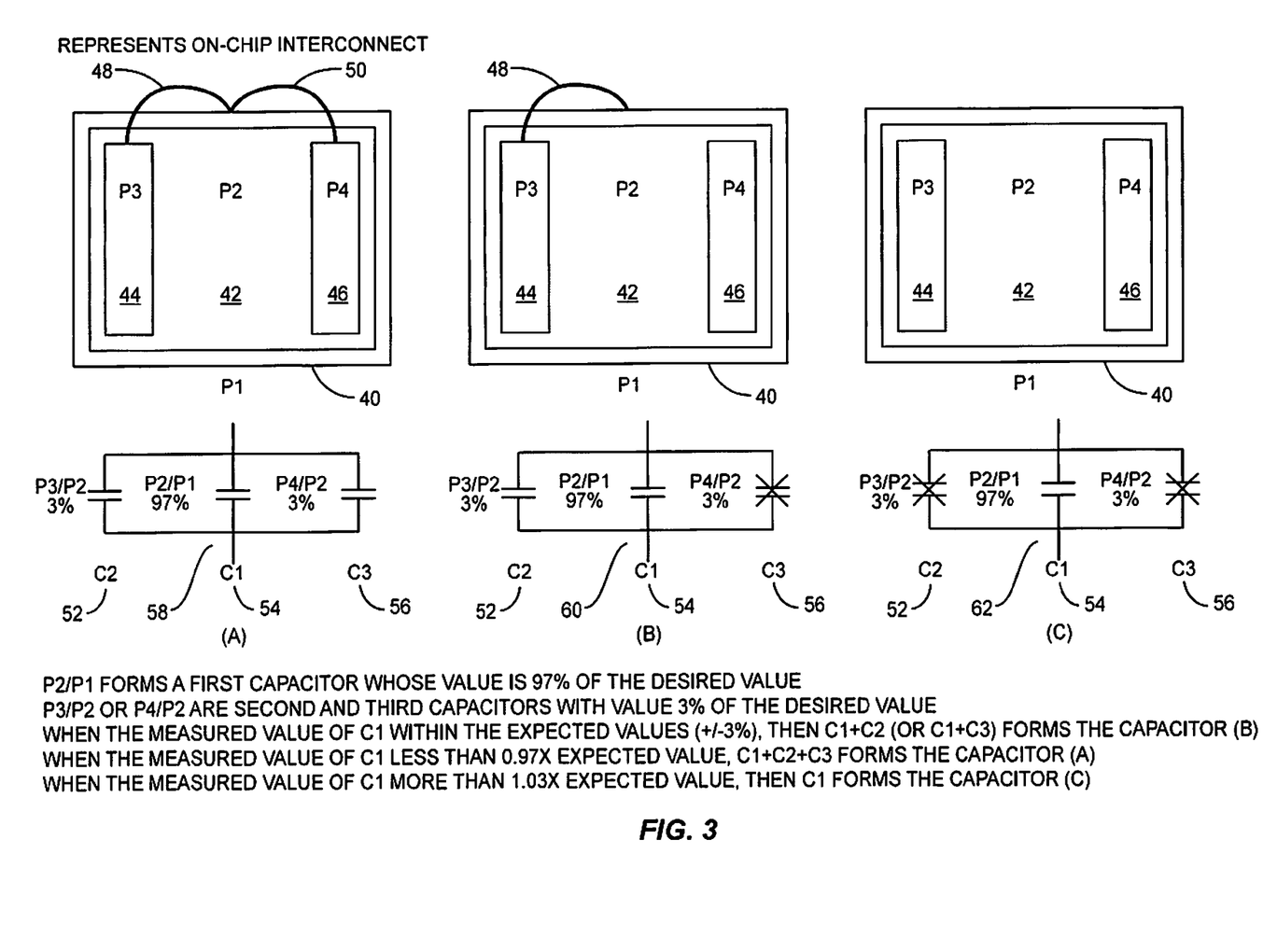
FIG. 3 shows a planar view and a schematic view of three possibilities of how to a capacitor with reduced variance is formed in one exemplary embodiment.

FIG. 3 shows a planar view and a schematic view of three possibilities of how to form a capacitor with reduced variance in one exemplary embodiment. Referring to the top row of column (A) of FIG. 3, a bottom plate P1 40 and a middle plate P2 42, placed on two different layers of a wafer, form a first capacitor C1 54, as seen in the bottom row of column (A). Two top plates P3 44 and P4 46 are placed on a top layer of the wafer above the layers in which the bottom plate P1 40 and the middle plate P2 42 reside. The middle plate P2 42 and the first top plate P3 44 form a second capacitor C2 52, as seen in the bottom row of column (A). The middle plate P2 42 and the second top plate P4 46 form a third capacitor C3 56, as seen in the bottom row of column (A).

In one embodiment, the bottom plate P1 40 and the middle plate P2 42 forms a first capacitor C1 54 whose value is 97% of the desired value of a nominal capacitor. The second and third capacitors 52 and 56 are formed to have a capacitance value that is approximately three percent (3%) of the desired value in one embodiment. In a wafer manufacturing process, when the first capacitor C1 54 is formed, its capacitance value is measured. When the measured value of the first capacitor C1 54 is outside the tolerance on the low end (less than 0.97× the desired value, then a nominal capacitor 58 having the desired value is formed by coupling the first capacitor C1 54 to both the second capacitor C2 52 and the third capacitor C3 56 (see bottom row of column A–C1+C2+C3 forms the nominal capacitor 58). The coupling of first capacitor C1 54 to both the second capacitor C2 52 and the third capacitor C3 56 may be done by on-chip interconnects. For example, an interconnect 48 may connect the bottom plate P1 40 to the first top plate P3 44 to add the second capacitor C2 52 and an interconnect 50 may connect the bottom plate P1 40 to the second top plate P4 46 to add the third capacitor C3 56. In one embodiment, these interconnects may be electrical connections and in one embodiment, the electrical connections may be made by etching away the layers between the respective plates that form the three capacitors.

When the measured value of the first capacitor C1 54 is within the expected tolerance values (+/−3% in one embodiment), then a nominal capacitor 60 is formed by coupling the first capacitor C1 54 to either the second capacitor C2 52 or the third capacitor C3 56 (see bottom row of column B–C1+C2 forms the nominal capacitor 60). As shown in column (B), only interconnect 48 is used, which connects the bottom plate P1 40 to the first top plate P3 44 to add the second capacitor C2 52. Although not shown in FIG. 3, the third capacitor C3 56 could have been added instead of the second capacitor C2 52.

When the measured value of the first capacitor C1 54 is outside the tolerance on the high end (is more than 1.03 times the desired value), then neither the second capacitor C2 52 nor the third capacitor C3 56 is added to the first capacitor C1 54. No interconnects are used in this situation, and the first capacitor C1 54 forms the nominal capacitor 62 (see bottom row of column C–C1+C2 forms the nominal capacitor 60).

By using a bottom plate of the capacitor that can be tested prior to the deposition of a second capacitor plate (as a stacked capacitor) that will consist of two pieces used for adjustment, the value of the stacked capacitor can be controlled to within a high degree of tolerability and reliability. For example, if a capacitance value of one picofarad (1 pF) is being targeted, a bottom plate would consist of a 0.97 pF capacitor based on a certain capacitance density (pF/mm2) of a dielectric. The capacitance value can be tested once the top plate of the bottom capacitor is formed. If the value is within the proper (or desired) specification limits, a 0.03 pF capacitor may be added on top, using a different deposition and a dielectric that gives random variation relative to the first capacitor, to achieve the desired value of 1 pF. If the measured capacitance density of the first capacitance is too low (in one embodiment, the target value is to be within 3% of the desired value), a second 0.03 pF capacitor can be added to push what would be failing capacitor values into the passing region). If the measured capacitance value of the first capacitor is too high (for example, greater than 3% of the desired value), then no additional 0.03 pF capacitors are electrically connected. The described process is done in manufacturing and requires three (3) mask plates and queuing of the wafers for adjustment. The adjustment capacitors sit directly on top of the "main" capacitor body.

Figure 4:
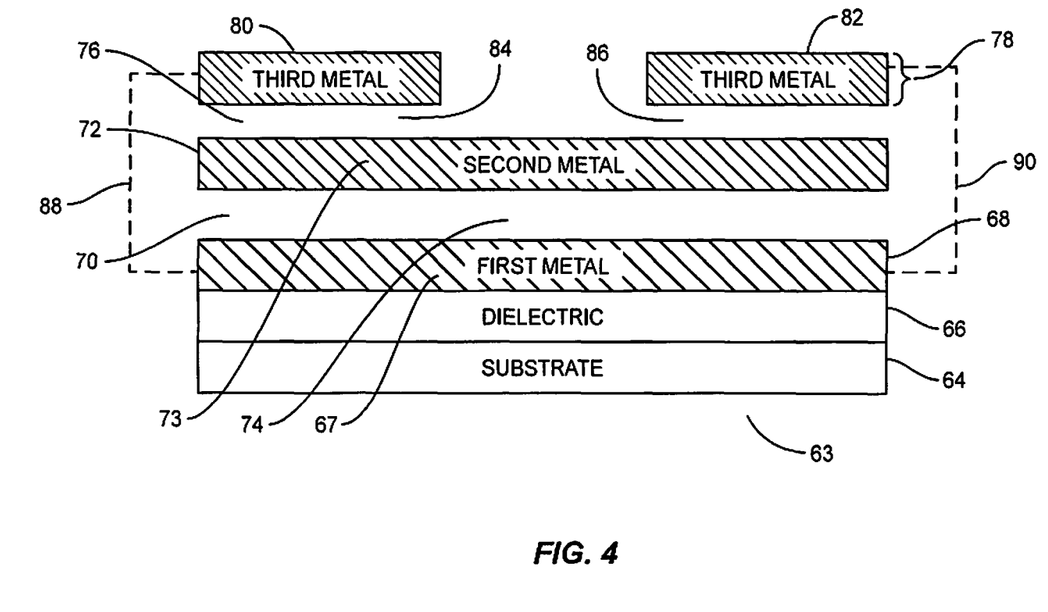
FIG. 4 illustrates an exemplary capacitor structure formed on a wafer according to the exemplary methods described herein.

FIG. 4 illustrates an exemplary capacitor structure 63 formed on a wafer according to the exemplary methods described herein. As part of a manufacturing process, a substrate 64 is formed with a dielectric layer 66 deposited over the substrate 64. A first metal layer 68 is provided over the dielectric layer 66. A bottom plate 67 may be provided in the first metal layer 68. A first dielectric layer 70 may be provided over the bottom plate 70. A second metal layer 72 with a middle plate 73 is then provided over the first metal layer 68 with the first dielectric layer 70 in between, such that the middle plate 73 resides over the bottom plate 67 to form a first capacitor 74 with a first capacitance. A second dielectric material 76 may be deposited over the second metal layer 72 having the middle plate 73. A third metal layer 78 may be provided which comprises a first top plate 80 and a second top plate 82 in the third metal layer 78 such that the first top plate 80 and the second top plate 82 reside over the middle plate 73 of the second metal layer 72, wherein the first top plate 80 and the middle plate 73 in the second metal layer 72 form a second capacitor 84 with a second capacitance, and the second top plate 82 and the middle plate 73 in the second metal layer 72 form a third capacitor 86 with a third capacitance. Electrical connections may be formed by optional vias 88 and 90 between the first metal layer 68 and the first top plate 80 and the second top plate 82, respectively, in the third metal layer 78 to selectively couple one or both of the second capacitor 84 and the third capacitor 86 in parallel with the first capacitor 74 to form the exemplary capacitor structure 63. In one embodiment, the capacitance value of the first capacitor 74 may be approximately 97% of the desired capacitance value of the exemplary capacitor structure 63 and each of the second and third capacitors 84 and 86 may be approximately three percent (3%) of the desired capacitance value of the exemplary capacitor structure 63.

In this manner, by measuring the capacitance of the first, bottom capacitor prior to the deposition of the second and/or third capacitor, different or corrected capacitors can be formed when the top plate(s) of the capacitor is placed, thereby improving the tolerance of the capacitance of the capacitor by correcting for values measured in the first, bottom capacitor.

Figure 5:
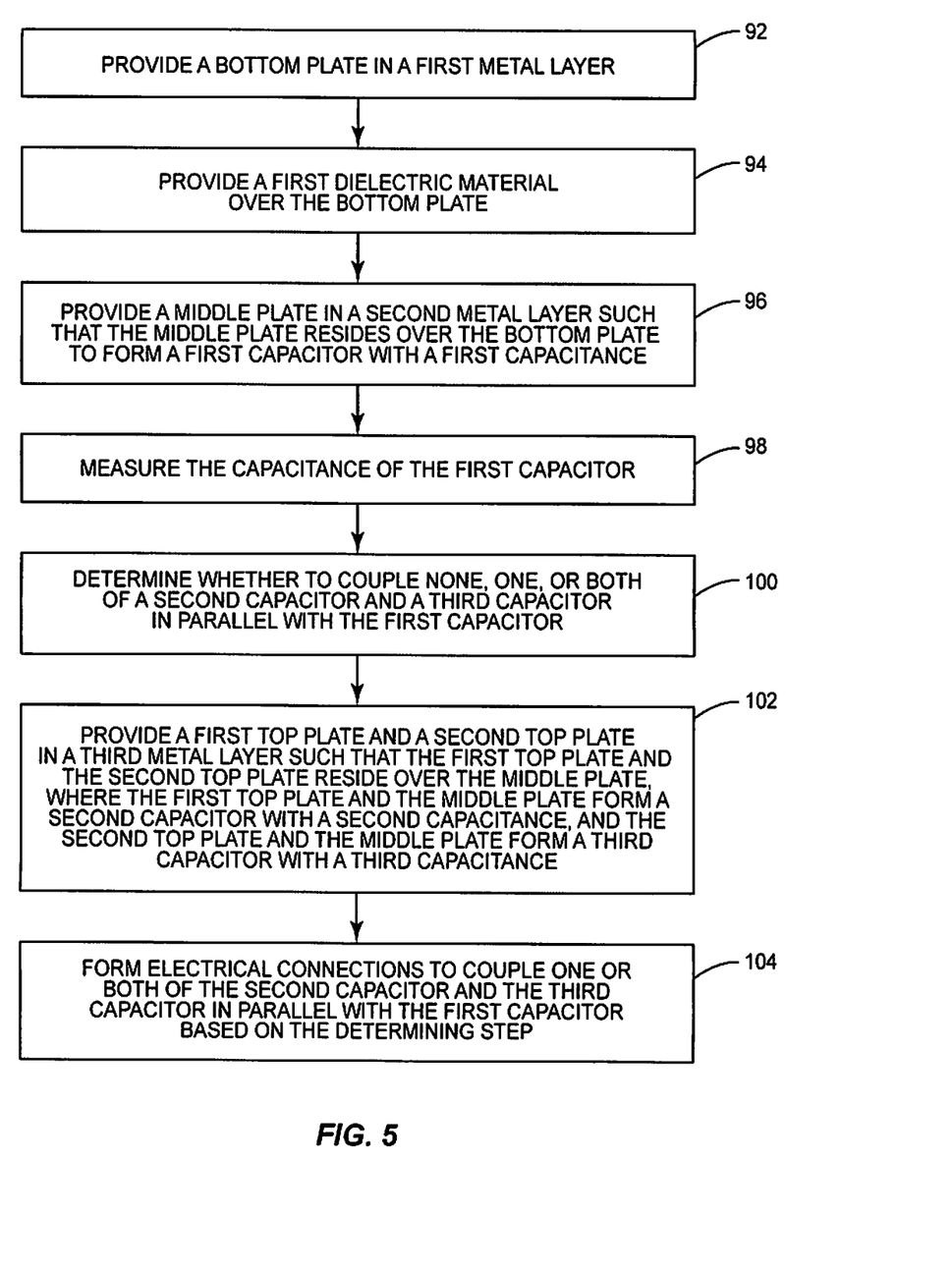
FIG. 5 is a flow diagram of an exemplary in-line method of making an adaptive capacitor having reduced variation in value.

FIG. 5 is a flow diagram of an exemplary in-line method of making an adaptive capacitors having reduced variation in value. Referring also to FIG. 4 for the relevant structure, the method in FIG. 5 starts by providing a bottom plate (bottom plate 67) in a first metal layer 68 (step 92). Then, a first dielectric material 70 is provided over the bottom plate 67 (step 94). The method of FIG. 5 further comprises providing a middle plate 73 in a second metal layer 72 such that the middle plate 73 resides over the bottom plate 67 to form a first capacitor 74 with a first capacitance (step 96).

The exemplary method also comprises measuring the capacitance of the first capacitor 74 (step 98). Then, a determination is made whether to couple none, one, or both of a second capacitor 84 and a third capacitor 86 in parallel with the first capacitor 74 (step 100). In one embodiment, this determination is made based on the measured value from step 98.

With continued reference to FIG. 5, the exemplary method may further comprise the step of providing a second dielectric material 76 over the middle plate 73 and providing a first top plate 80 and a second top plate 82 in a third metal layer 78 such that the first top plate 80 and the second top plate 82 reside over the middle plate 73, wherein the first top plate 80 and the middle plate 73 form the second capacitor 84 with a second capacitance, and the second top plate 82 and the middle plate 73 form the third capacitor 86 with a third capacitance (step 102). In step 104, electrical connections 88 and 90 may be formed to couple one or both of the second capacitor 84 and the third capacitor 86 in parallel with the first capacitor 74 if the determining whether to couple none, one, or both of a second capacitor 84 and a third capacitor 86 in parallel with the first capacitor 74 results in a determination to couple one or both of the second capacitor 84 and the third capacitor 86 in parallel with the first capacitor 74.

In this manner, by measuring the capacitance of the first, bottom capacitor prior to the deposition of the second and/or third capacitor, different or corrected capacitors can be formed when the top plate(s) of the capacitor is placed, thereby improving the tolerance of the capacitance of the capacitor by correcting for values measured in the first, bottom capacitor.

Figure 6:
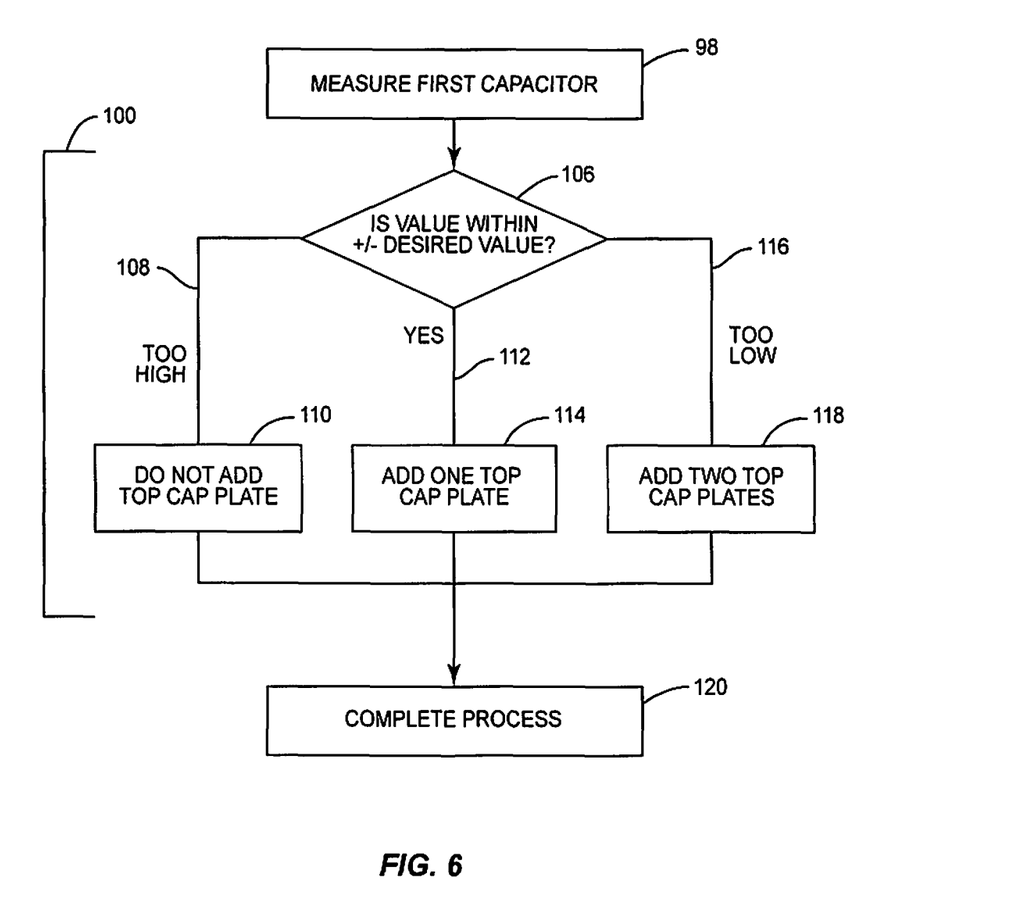
FIG. 6 is a flow diagram of an exemplary determining process of FIG. 5 to see which, if any, of the second and third capacitors should be added to the first capacitor.

FIG. 6 is a flow diagram of an exemplary determining process 100 of FIG. 5 to see which, if any, of the second and third capacitors 84 and 86 should be added to the first capacitor 74. In step 98, the capacitance of the first capacitor 74 is measured. The determining process 100 comprises determining whether the measured value is within a certain tolerance of the desired value (step 106). In one embodiment, the tolerance may be plus or minus three percent (3%). If the measured value is too high (for example, at or above the desired value) (branch 108), then neither of the second or third capacitors 84 and 86 are coupled to the first capacitor (such as first capacitor 74) by electrically connecting the top plates 80 and 82 to the bottom plate 67 to add any capacitance (step 110). If the measured capacitance value of the first capacitor 74 is within the tolerance of the desired value (plus or minus 3% in one embodiment) (branch 112), then one of the second or third capacitors 84 and 86 are coupled to the first capacitor (such as first capacitor 74) by electrically connecting one of the top plates 80 and 82 to the bottom plate 67 to add capacitance (step 114). If the measured capacitance value of the first capacitor 74 is too low—lower than the tolerance of the desired value (plus or minus 3% in one embodiment) (branch 116)—then both of the second or third capacitors 84 and 86 are coupled to the first capacitor (such as first capacitor 74) by electrically connecting both of the top plates 80 and 82 to the bottom plate 67 to add capacitance (step 118). The process is then complete at step 120.

In this manner, by measuring the capacitance of the first, bottom capacitor prior to the deposition of the second and/or third capacitor, different or corrected capacitors can be formed when the top plate(s) of the capacitor is placed, thereby improving the tolerance of the capacitance of the capacitor by correcting for values measured in the first, bottom capacitor.

An alternative approach is to form the capacitors by connecting to the top plate with a via from a higher metal level. For example, it is possible to place two MIM capacitors but modify the wiring by using different via masks to form MIMs that sum to the desired value/tolerance. Removal or addition of the vias allows for capacitor adjustment.

Another alternative way to accomplish the "tuning" is to use something similar to MEMs where the film itself can be trimmed (thinned) locally based on either electrical or optical measurements to adjust the value of the capacitor.

Those skilled in the art will recognize improvements and modifications to the present disclosure. All such improvements and modifications are considered within the scope of the concepts disclosed herein.

What is claimed is:

1. A method of making a capacitor with reduced variance in value, the method comprising:
   providing a bottom plate in a first metal layer;
   providing a first dielectric material over the bottom plate;
   providing a middle plate in a second metal layer such that the middle plate resides over the bottom plate to form a first capacitor with a first capacitance;
   measuring the first capacitance of the first capacitor to obtain a first measured capacitance;
   determining whether to couple none, one, or both of a second capacitor and a third capacitor in parallel with the first capacitor;
   providing a second dielectric material over the middle plate; and
   providing a first top plate and a second top plate in a third metal layer such that the first top plate and the second top plate reside over the middle plate, wherein the first top plate and the middle plate form the second capacitor with a second capacitance, and the second top plate and the middle plate form the third capacitor with a third capacitance,
   wherein electrical connections are formed to couple one or both of the second capacitor and the third capacitor in parallel with the first capacitor if the determining whether to couple none, one, or both of the second capacitor and the third capacitor in parallel with the first capacitor results in a determination to couple one or both of the second capacitor and the third capacitor in parallel with the first capacitor.

2. The method of claim 1, wherein the determining is based on the first measured capacitance of the first capacitor.

3. The method of claim 2, wherein if the first measured capacitance is higher than a tolerance within a desired value, then the method comprises coupling neither of the second or third capacitors to the first capacitor.

4. The method of claim 3, wherein the tolerance within a desired value is plus or minus three percent (3%) of the desired value.

5. The method of claim 2, wherein if the first measured capacitance is lower than a tolerance within a desired value, then the method comprises coupling both of the second or the third capacitors to the first capacitor.

6. The method of claim 5, wherein the tolerance within a desired value is plus or minus three percent (3%) of the desired value.

7. The method of claim 2, wherein if the first measured capacitance is within a tolerance of a desired value, then the method comprises coupling one of the second or the third capacitors to the first capacitor.

8. The method of claim 7, wherein the tolerance within a desired value is plus or minus three percent (3%) of the desired value.

9. The method of claim 1, wherein the providing the middle plate in a second metal layer such that the middle plate resides over the bottom plate forms a first capacitor having a capacitance value of approximately 97% of a desired value.

10. The method of claim 1, wherein the providing the first top plate and the second top plate in the third metal layer such that the first top plate and the second top plate reside over the middle plate forms a second capacitor and a third capacitor, each having a capacitance of approximately 3% of the desired value.

11. The method of claim 1, wherein the measuring step is performed during a wafer manufacturing process.

12. The method of claim 1, wherein the measuring step is performed prior to the providing of the first top plate and the second top plate in the third metal layer to form the second capacitor and the third capacitor.

13. The method of claim 1, wherein the first capacitor has a capacitance value of approximately 97% of a desired value for the capacitor structure.

14. The method of claim 13, wherein the second capacitor and the third capacitor each has a capacitance of approximately 3% of the desired value.

15. The method of claim 1, wherein the method further comprises coupling one of the second capacitor and the third capacitor in parallel with the first capacitor during a wafer manufacturing process via the electrical connections.

16. The method of claim 1, wherein the method further comprises coupling both the second capacitor and the third capacitor in parallel with the first capacitor during a wafer manufacturing process via the electrical connections.

17. The method of claim 1, further comprising forming the electrical connections by vias between the bottom plate in the first metal layer and the first top plate and the second top plate, respectively, in the third metal layer, to selectively couple one or both of the second capacitor and the third capacitor in parallel with the first capacitor to form the capacitor structure.

18. The method of claim 17, wherein forming the electrical connections by the vias comprises etching away one or more of a plurality of dielectric layers between the respective bottom, middle, and first and second top plates.

* * * * *